United States Patent [19]
Fukuyama

[11] Patent Number: 5,663,104
[45] Date of Patent: Sep. 2, 1997

[54] METHOD OF MANUFACTURING A SEMICONDUCTOR DEVICE FOR POWER SUPPLY USE

[75] Inventor: Jun Fukuyama, Fukuoka, Japan

[73] Assignee: Rohm Co., Ltd., Kyoto, Japan

[21] Appl. No.: 447,439

[22] Filed: May 23, 1995

[30]     Foreign Application Priority Data

Jun. 3, 1994   [JP]   Japan ................................ 6-122587

[51] Int. Cl.$^6$ ..................................................... H01L 21/60
[52] U.S. Cl. ...................... 438/123; 264/272.17; 29/827; 438/124
[58] Field of Search ................................. 437/209, 211, 437/216; 257/687, 707, 708, 711

[56]             References Cited

U.S. PATENT DOCUMENTS

| | | | |
|---|---|---|---|
| 4,888,307 | 12/1989 | Spairisano et al. | 437/216 |
| 4,961,106 | 10/1990 | Butt et al. | 257/687 |
| 5,304,843 | 4/1994 | Takubo et al. | 437/211 |
| 5,491,111 | 2/1996 | Tai | 437/211 |

FOREIGN PATENT DOCUMENTS 03293738   12/1991   Japan .
04257246   9/1992   Japan .

*Primary Examiner*—John Niebling
*Assistant Examiner*—Michael S. Lebentritt
*Attorney, Agent, or Firm*—Brumbaugh, Graves, Donohue & Raymond

[57]             ABSTRACT

A method of manufacturing a semiconductor device for power supply use. A void is formed on a mating face of a pair of metallic molds. Moreover, an island of a lead frame is arranged in the void under the condition that the island is spaced from a surface of the void. A thermosetting resin is injected into the void so that the island and a semiconductor element assembled onto one face of the island are sealed by resin. At this time, a clearance between the other face of the island and one face of the metallic mold opposed to the other face of the island is set to be 2.0 to 0.3 mm and is smaller than a clearance between one face of the island and the other face of the metallic mold opposed to one face of the island. One face of the metallic mold is subjected to satin finish on which the maximum surface roughness $H_{max}$ is in a range from 3 to 10 μm.

8 Claims, 5 Drawing Sheets

| Hmax \ HI | 5.0 | 3.5 | 2.0 | 1.5 | 1.0 | 0.5 | 0.3 | 0.2 | 0.1 |
|---|---|---|---|---|---|---|---|---|---|
| MIRROR FACE (NOT MORE THAN 1 μm) | — | — | ○ | ○ | ○ | ○ | ○ | ○ | ○ |
| 3 μm | — | — | — | — | — | — | — | ○ | ○ |
| 5 μm | — | — | — | — | — | — | — | ○ | ○ |
| 10 μm | — | — | — | — | — | — | — | ○ | ○ |
| 15 μm | — | — | — | — | — | — | — | — | ○ |
| 20 μm | — | — | — | — | — | — | — | — | ○ |

1

METHOD OF MANUFACTURING A SEMICONDUCTOR DEVICE FOR POWER SUPPLY USE

FIELD OF THE INVENTION

The present invention relates to a method of manufacturing a semiconductor device for power supply use in which a thermosetting resin is utilized, and more particularly relates to a method of manufacturing a semiconductor device, the island for assembling a semiconductor element of which is large, for example, a semiconductor device used for supplying power.

BACKGROUND OF THE INVENTION

By way of example of the conventional power semiconductor device, a power transistor has been employed.

Since this type power transistor is used for supplying a large amount of electric power, consideration is sufficiently given to heat radiation.

FIG. 6 is a sectional view of the power transistor. In the power transistor, a frame 11 to which a transistor element 10 is assembled is arranged in such a manner that the bottom face of an island 11A is exposed outside of a border 12A of a resin body 12. In the thus composed power transistor, a screw 15 is inserted into a through-hole 12B of the resin body 12 and screwed to a radiating plate 16. Due to the foregoing, heat generated in the transistor 10 is quickly released through the frame 11, so that the effect of heat radiation is enhanced.

However, in this resin sealing type power transistor, the frame 11 is exposed outside. Therefore, it is very difficult to maintain an insulating condition of the frame 11. A method for maintaining the insulation is described as follows. In the case of fixing the frame 11 to the radiating plate 16 with a screw, it is necessary to interpose an insulating plate 17 such as a mica plate between the frame 11 and the radiating plate 16. However, it is complicated.

Due to the circumstances described above, a construction in which the frame 11 is completely accommodated in the resin body 12, that is, a full package structure is commonly used (shown in Japanese Examined Patent Publication No. 5-12857).

With reference to FIG. 7, a method of manufacturing a power transistor of the full package structure will be explained below.

Reference numeral 20 is a metallic mold, which is composed of an upper metallic mold 20A and a lower metallic mold 20B. In a void 21 formed by the upper and lower metallic molds 20A, 20B, an island 11A of the frame 11 is set downward under the condition that the island 11A is spaced from the lower mold surface. Then a thermosetting resin is injected into the void 21 from a resin inlet formed on a mating face of the upper and lower metallic molds 20A, 20B.

While the injected resin is filled into the void 21 of the metallic mold 20, it is hated (at about 200° C.) by a heater block not shown in the drawing. Therefore, the injected resin is hardened by the reaction of a hardening agent contained in the resin.

Then the resin body 12, which has been hardened, and the frame 11 are separated from the metallic mold 20, and laser beam marking is effected on the surface 12B of the resin body 12.

In the frame 11, a bend portion 11C is formed, and the distance H1 between the island 11A of the frame 11 and the lower metallic mold 20B, and distance H2 between the surface 11B of the frame 12 and the upper metallic mold are determined to be H1<<H2. When distance (wall thickness) H1 between the island 11A of the frame 11 and the lower metallic mold 20B is reduced as described above, in the same manner as that shown in FIG. 6, when this transistor of the full package structure is assembled onto the radiating plate 16, it is possible to effectively release generated heat from the frame 11 to the radiating plate 16. The characteristic of the power transistor is greatly affected by distance H1 between the island 11A and the lower metallic mold 20B. That is, the shorter the distance H1 is, the more the radiation is enhanced.

Since laser beam marking is effected on a surface of the resin body 12 formed in the void 21, an entire surface of the metallic mold 20 for forming the void 21 is generally subjected to mirror finish on which the maximum surface roughness is not more than 1 μm. The reason why the entire surface of the metallic mold 20 is subjected to mirror finish is described as follows. When a resin surface of mirror finish is subjected to laser beam marking, a surface of the marked portion becomes rough in the manner of satin finish, so that the contrast of the marked portion is improved as compared with a portion in which laser beam marking is not effected. (This technique is disclosed in Japanese Unexamined Patent Publication No. 4-257246.) Other reasons why the metallic mold of mirror finish is used are described as follows. Compared with a metallic mold of satin finish in which voids are formed by carving by means of electric discharge machining, a metallic mold of mirror finish in which a plurality of metallic mold members that have been individually made are combined, can be easily machined in the case where a resin body 8 having a step portion shown in FIG. 4 is formed, and further when the metallic mold has been worn away, the metallic mold can be partially replaced, which is economical.

However, when wall thickness H1 is reduced as described above in the case of a conventional full package type power transistor, the following problems may be encountered.

FIG. 8 is a view showing a condition in which molten resin J flows into a clearance formed between the island 11A and the lower metallic mold 20B and hardens when molten resin J comes into contact with the lower metallic mold 20B, the temperature of which is raised when it is heated by a heater block not shown.

When molten resin J is injected into the metallic mold 20 having small clearance H1 described above, pressure of molten resin J is raised because clearance H1 is so small. Since the surface of the lower metallic mold 20B is a surface subjected to mirror finish and further the injection pressure is high, a hardening acceleration portion A which comes into contact with the metallic mold 20 and starts hardening slides in the flowing direction of molten resin J, so that the portion A is pushed forward and joined to another hardening acceleration portion A which is pushed forward from another side.

In this way, a confluence B is formed. The confluence B appears on a surface of the resin body 12 and cloudy pattern is formed, so that the appearance of the surface is deteriorated. Further the confluence B becomes porous because of the cloudy pattern, which could be a cause of the ingress of water (shown in FIG. 9). Water enters the porous confluence B from the cloudy pattern that has appeared on the surface of the resin body 12. Finally, water reaches the island 11A and comes into contact with the transistor 10 assembled onto the surface of the island 11A. Due to the foregoing, the transistor element 10 is damaged in some cases.

When the resin body 12 that has been sealed with resin is released from the lower metallic mold 20B, since an adhesive force between the island 11A and the resin is low at the confluence B, an adhesive force between the surface of the lower metallic mold 20B and the resin overcomes the adhesive force between the island 11A and the resin, so that the resin is drawn to the lower metallic mold 20B side, and a blister C is generated (shown in FIG. 10). One of the reasons why the blister C is generated is that the resin is not completely separated from the surface of the metallic mold 20 because the surface of the metallic mold 20 is subjected to mirror finish on which the surface roughness is not more than 1 μm. However, it is considered that the main reason is the deterioration of adhesion between the island 11A and the resin 12 which is caused by the cloudy confluence B.

When the blister C occurs in the resin boy 12, not only the appearance is deteriorated but also a sufficiently large area of the contact surface can not be ensured between the radiating plate 16 and the resin body 12 because of the blister C.

SUMMARY OF THE INVENTION

An object of the present invention is to provide method of manufacturing a semiconductor device of high heat radiation property without causing defective molding.

In the method of manufacturing a semiconductor device, a void is formed on a mating face of a pair of metallic molds. Moreover, an island of a lead frame is arranged in the void under the condition that the island is spaced from the lower mold surface. Furthermore, a thermosetting resin is injected into the void so that the island and a semiconductor element assembled onto one face of the island are sealed by resin. At this time, a clearance between the other face of the island and one face of the metallic mold opposed to the other face of the island is set to be 2.0 to 0.3 μm and is smaller than a clearance between one face of the island and the other face of the metallic mold opposed to one face of the island. One face of the metallic mold is subjected to satin finish in which the maximum surface roughness $H_{max}$ is in a range from 3 to 10 μm.

According to the above method, resin flows into a clearance formed between the other face of the island and one face of the metallic mold opposed to the other face of the island. After the resin has flowed into the clearance, the resin starts hardening at a position where the resin comes into contact with the metallic mold. After the start of hardening; the resin flows into a very small clearance of 2.0 to 0.3 mm. Therefore, the injection pressure is raised in the same manner as that of the conventional method so that the resin which has started hardening is pushed forward, however, since the irregular surface of satin finish engages with the resin which has already started hardening. Accordingly, pushing (sliding) of the resin is suppressed by the engagement. Consequently, after the resin has started hardening, it is prevented from being pushed forward and entering the inside of the resin on the island side under a semi-hardened condition.

When the present invention is applied to a power transistor, the slide of resin that has started hardening is remarkably suppressed from the following reasons: A surface area of the island of the power transistor onto which the transistor element is assembled is much larger than the surface areas of the islands of other semiconductor devices. Usually, the surface area is so large that the resin body is substantially divided into two portions by the island accommodated in the resin body, that is, the surface area exceeds 80%. Therefore, the slide of resin is remarkably suppressed.

Furthermore, a tapered portion is formed at an end of the island opposed to a gate from which the thermosetting resin is injected. The tapered portion tapers off to one face of the metallic mold opposed to the other face of the island, in the case where resin is injected in a clearance between the other face of the island and one face of the metallic mold opposed to the other face. Therefore, the injection of resin into the small clearance is facilitated, and bubbles generated in the periphery of the end of the island are prevented from being involved in the resin.

BRIEF DESCRIPTION OF THE DRAWINGS

The invention will be disclosed in detail with reference to the following drawings wherein.

DETAILED DESCRIPTION OF THE INVENTION

An embodiment in which the present invention is applied to a power transistor will be explained with reference to FIG. 1. However, it should be noted that the present invention is not limited to the specific embodiment. It is possible to apply the present invention to semiconductor devices used for supplying power having large islands to which heat radiation properties are required.

Figure 1:
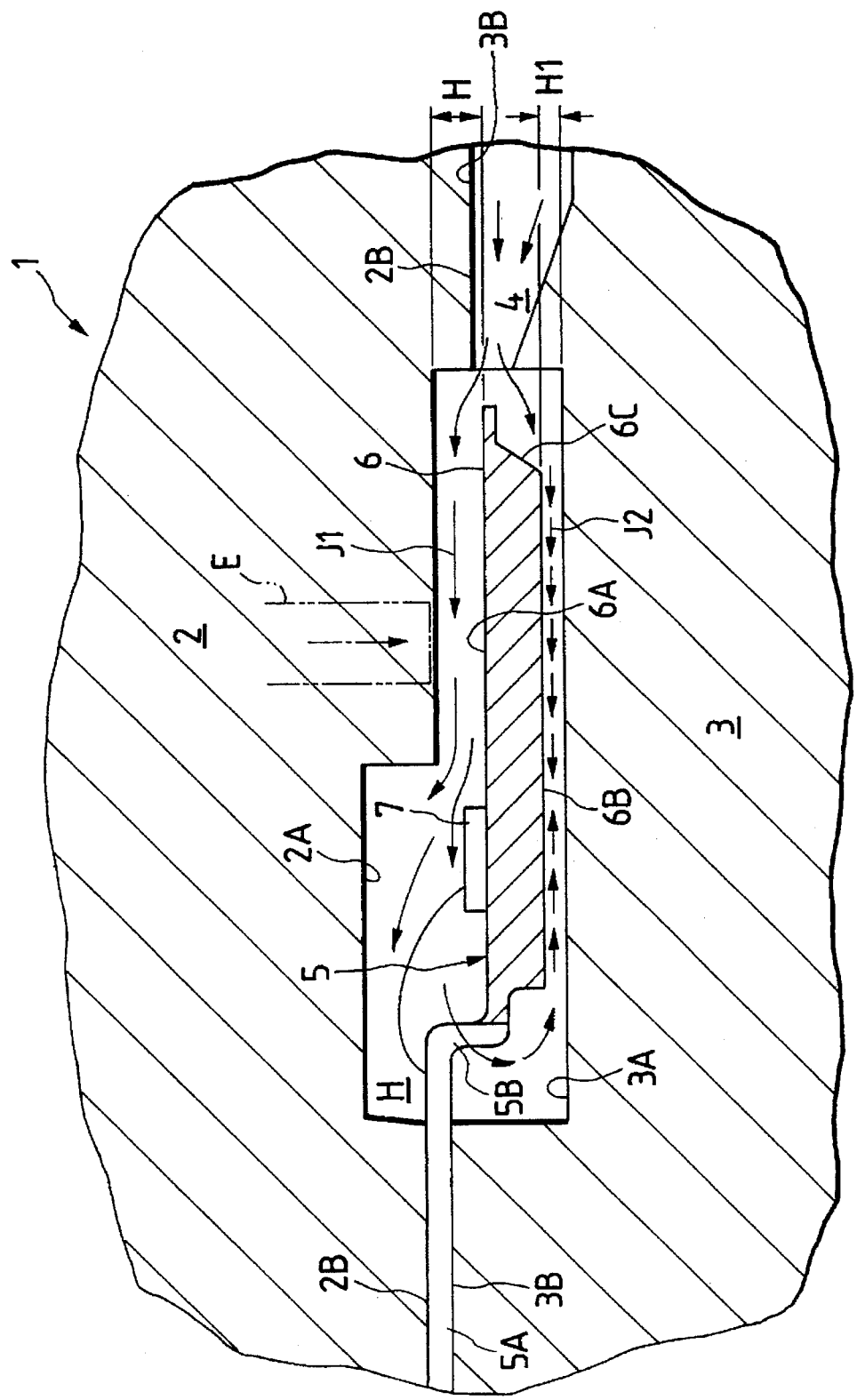
FIG. 1 is a cross sectional view showing an embodiment of the semiconductor device of the present invention in which the present invention is applied to a power transistor.

In FIG. 1, numeral 1 is a metallic mold. This metallic mold 1 is composed of an upper metallic mold 2 and a lower metallic mold 3. A void H is formed on a mating face of the upper and lower metallic molds 2, 3. A surface of the recess 2A of the upper metallic mold 2 forming the void H is a mirror face, the surface roughness of which is not more than 1 μm, and a surface of the recess 3A of the lower metallic mold 3 is subjected to satin finish by means of electric discharge machining.

A method of manufacturing a power transistor in which the metallic mold 1 described before is used will be explained as follows.

First, an island 6 of the lead frame 5 is arranged in the void H under the condition that the island 6 is spaced from the lower surface of the void H. Then the island 6 is fixed in the void H in such a manner that a lead 5A of the lead frame 5 is interposed between mating faces 2B, 3B at the rear of the upper and lower metallic molds 2, 3. After the island 6 has been fixed, molten resin J is injected into the void from a gate 4 provided at the front of the mating faces 2B, 3B at a predetermined injecting pressure. Thermosetting epoxy resin generally used for the semiconductor device is employed for the molten resin J.

After the molten resin J has been injected into the void from the gate 4, a current of the molten resin J collides with an end portion of the island 6 to which the transistor element 7 is assembled, and the current of the molten resin J is divided into two currents of an upper side current J1 on the front side 6A and a lower side current J2 on the reverse side 6B. In this case, first, the upper side current J1 flows on the front side 6A because it is possible to inject the molten resin on the front side 6A at low pressure. At a point of time when the upper side current J1 has flowed into a small clearance on the reverse side 6B from a rear end portion opposed to the aforementioned end portion of the island 6, the lower side current J2 substantially starts flowing into the clearance. The reason why the upper and lower side currents flow into the clearance in the above manner is described as follows.

A bend portion 5B between the lead 5A and the island 6 is formed into a down-set structure in which clearance H1 formed between the reverse side 68 of the island 6 and the surface of the recess 3A of the lower metallic mold 3 is sufficiently smaller than clearance H2 formed between the front surface 6A and the surface of the recess 2A of the upper metallic mold 2. Due to the down-set structure described above, the wall thickness of resin on the lower side of the island 6 is reduced, so that the heat radiating effect can be provided.

Figure 7:
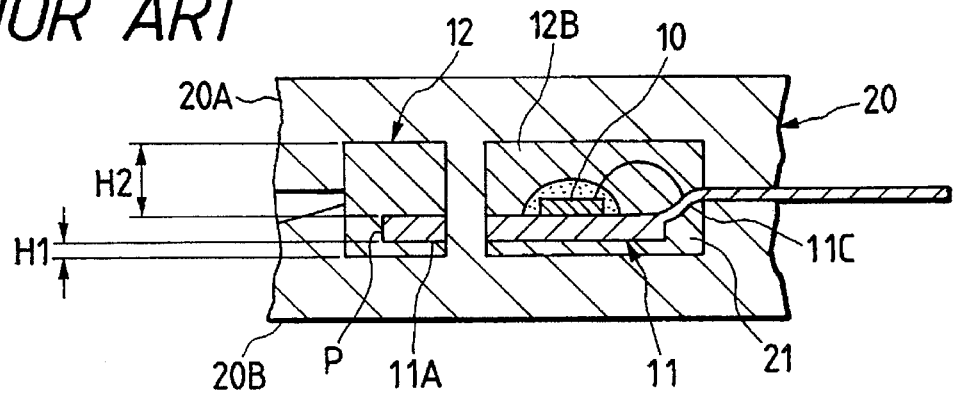
FIG. 7 is a cross sectional view for explaining a method of manufacturing a conventional power transistor.
Figure 8:
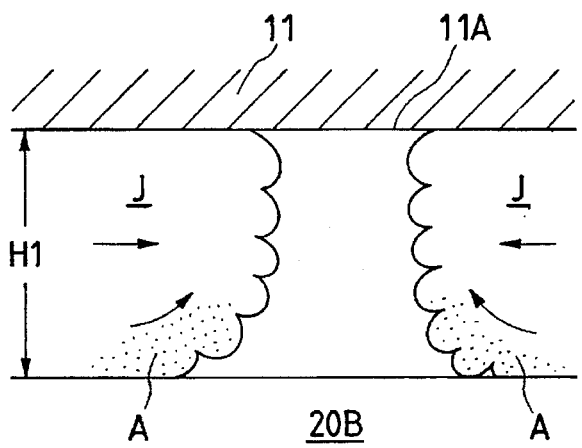
FIG. 8 is an enlarged schematic illustration showing a condition immediately before an upper and a lower side current in FIG. 7 are joined to each other.
Figure 9:
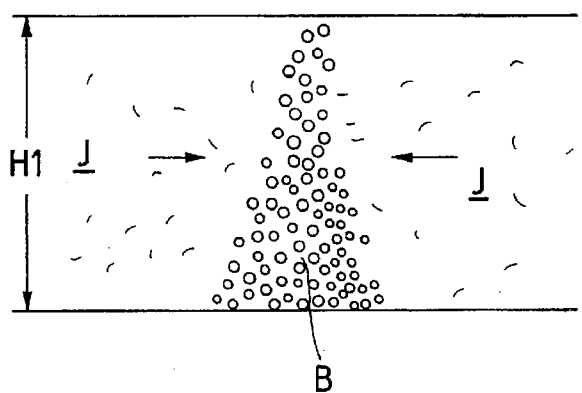
FIG. 9 is an enlarged schematic illustration showing a condition in which the upper and lower side currents in FIG. 8 are joined to each other.
Figure 10:
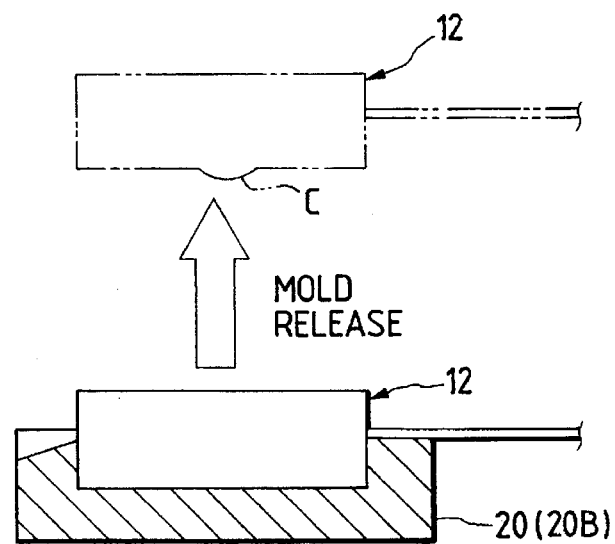
FIG. 10 is a schematic illustration for explaining a condition in which a power transistor manufactured by the conventional method shown in FIG. 7 is released from a metallic mold.

Numeral 6C is a tapered portion arranged for the purpose of allowing the lower side current J2 to flow smoothly. When the tapered portion 6C is provided in the above manner, even if the thickness of the island 6 is increased, it is possible to prevent air from being involved in the periphery P of the end portion of the island 11A in FIG. 7.

A space into which the upper side current J1 flows is different from that into which the lower side current J2 flows (H1<H2). Therefore, the pressure required for the upper side current J1 is different from that required for the lower side current J2. For this reason, as illustrated in FIG. 1, the upper side current J1 and the lower side current J2 are joined with each other in a clearance formed between the reverse face 6B of the island 6 and the front face of the recess 3A of the lower metallic mold 3.

Figure 2:
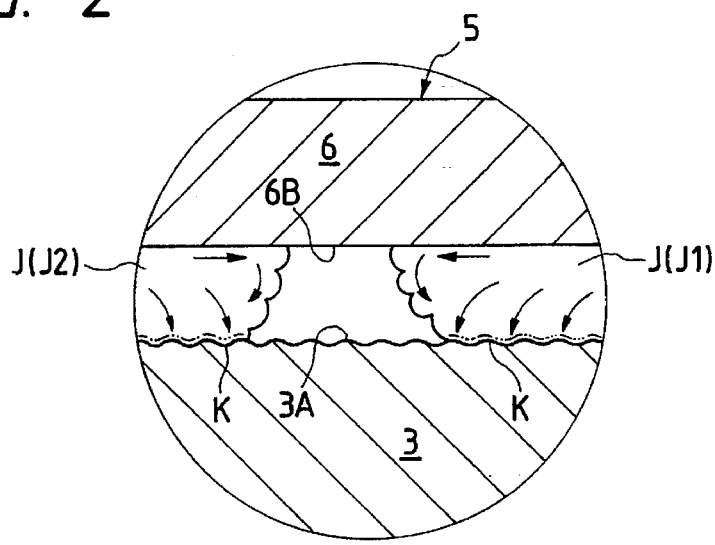
FIG. 2 is an enlarged schematic illustration showing a condition immediately before an upper and a lower side current in FIG. 1 are joined to each other.

FIG. 2 is a schematic illustration showing a condition immediately before the upper side current J1 and the lower side current J2 are joined with each other. When the molten resin J comes into contact with a surface of the recess 3A of the lower metallic mold 3 heated by a heater block not shown in the drawing, the molten resin J is heated and starts hardening. In the same manner as that of the conventional metallic mold of mirror finish, the semi-hardened resin K that has started hardening is pushed forward by the influence of the resin current. However, in the present invention, the surface of the recess 3A is subjected to satin finish in which the maximum surface roughness Hmax is maintained to be 3 to 10 μm. Accordingly, unlike the conventional case, the semi-hardened molten resin K is prevented from being pushed forward, so that it is not mixed with the molten resin J. The reason why the semi-hardened molten resin K is prevented from being pushed forward is that the semi-hardened molten resin K is difficult to be affected by a resin current flowing from the back when smooth irregularities (a surface subjected to satin finish) of the recess 3A engage with the semi-hardened molten resin K. In order to prevent the influence of the resin current flowing from the back, a sufficiently high effect can be expected only when the surface of the recess 3A is subjected to satin finish by means of electric discharge machining or sand blast. It can be assumed that the more rough the surface is, the more effect can be provided. However, in the present invention, the maximum surface roughness is determined to be $H_{max}$ 3 to 10 μm. The reason will be explained below referring to FIGS. 3 to 5.

Figure 3:
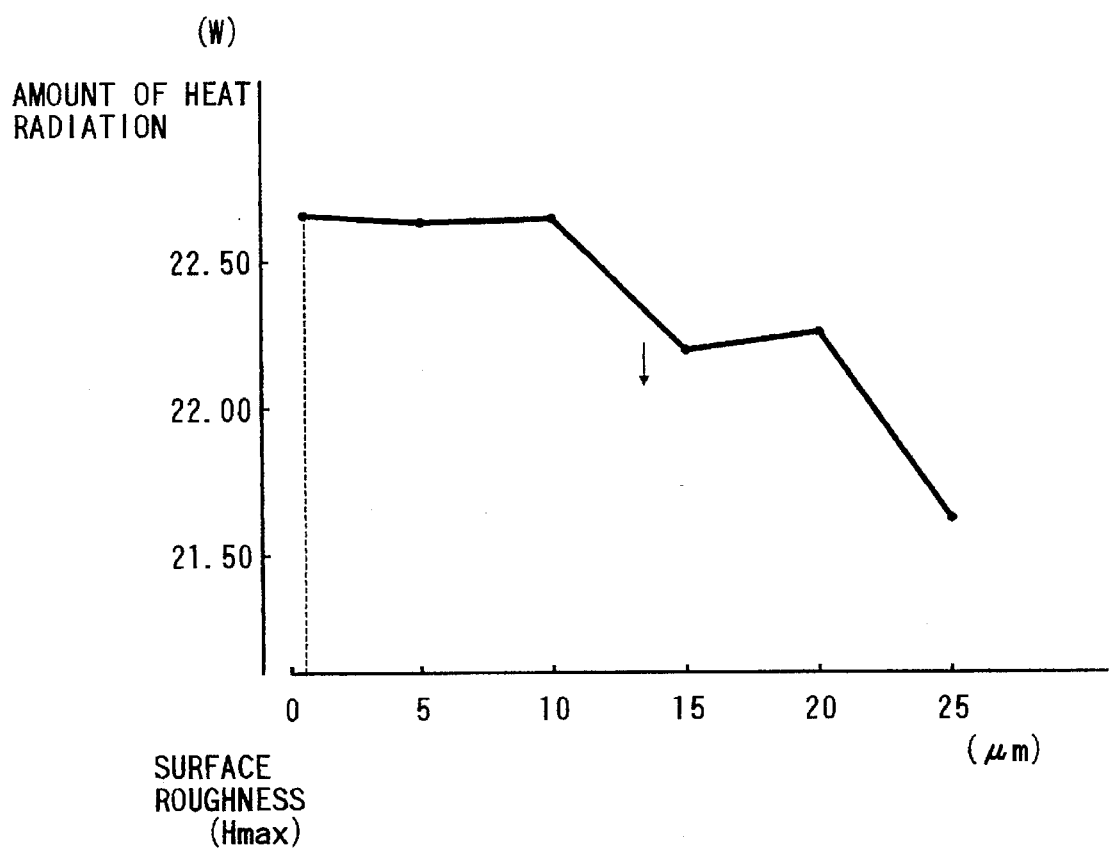
FIG. 3 is a graph showing a heat radiation characteristic with respect to the surface roughness.

FIG. 3 is a graph showing the heat radiation characteristic with respect to the surface roughness of the recess 3A. This graph showing the heat radiation characteristic was made in the following manner.

Power transistors were made in such a manner that the maximum surface roughness $H_{max}$ of the recess 3A was changed in a range from a mirror surface of not more than 1 μm to a surface of 25 μm. Amounts of heat radiation of the thus obtained power transistors were measured and an average of 20 samples was plotted at regular intervals of 5 μm. The measuring conditions were as follows. The resin body 8 of the power transistor was assembled to the heat radiation plate 9 shown in FIG. 4 using screws, and a current and voltage of $I_c$=1 A and $V_{CE}$=20 V were impressed for 4 seconds, and the heat radiation amount W was measured.

As can be seen from the graph, when the maximum surface roughness $H_{max}$ of the, recess 3A exceeded 10 μm, the heat radiation amount of the molded power transistor was decreased, so that the heat radiation characteristic was deteriorated. The reason why the heat radiation characteristic was deteriorated is considered as follows. When the maximum surface roughness $H_{max}$ of the recess 3A exceeded 10 μm, the heat radiation surface 8A of the resin body 8 molded by the recess 3A was not sufficiently contacted with the heat radiation plate 9. Therefore, the heat transmission efficiency from the heat radiation surface 8A to the heat radiation plate 9 was deteriorated.

Figures 4, 5:
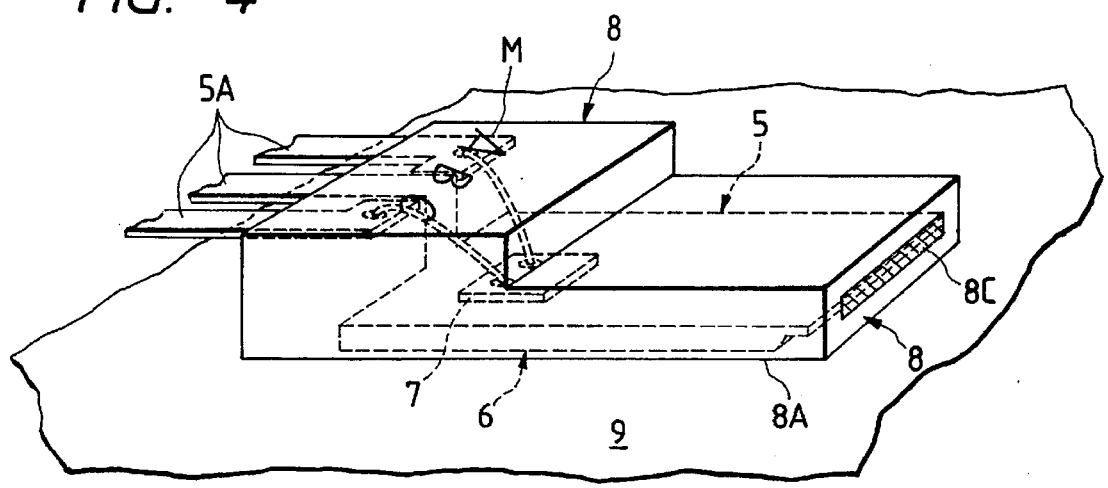
FIG. 4 is a perspective view showing a power transistor manufactured according to the present invention.
FIG. 5 is a table showing a relation between the maximum surface roughness $H_{max}$ and the wall thickness H1.
Figure 6:
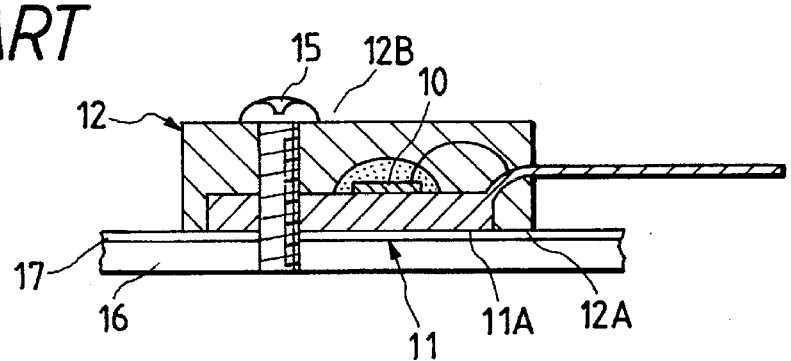
FIG. 6 is a cross sectional side view showing a condition in which the power transistor is assembled to the heat radiation plate.

FIG. 5 is a table on which the result of an investigation is shown. The investigation was made in the following manner.

As compared with a surface of mirror finish, when the maximum surface roughness $H_{max}$ of the recess 3A was reduced, the occurrence of a cloudy pattern caused by the semi-hardened molten resin K or the occurrence of a blister is shown on the table. In this case, the distance H1 between the reverse side 6B of the island 6 and the recess 3A of the lower metallic mold 3 was changed. (This distance H1 will be referred to as a wall thickness H1, hereinafter.) On the table, the mark ○ represents the occurrence of defects such as a cloudy pattern, blister and incomplete charge of resin, and the mark – represents no occurrence of defects.

With reference to this table, no defects can be seen even in the case of the mirror surface when the wall thickness H1 exceeds 2.0 μm. The reason is considered to be an alleviation of the influence of the current of molten resin J in accordance with an increase in the wall thickness H1. Even on a surface of satin finish, the maximum surface roughness of which is not less than 3 μm, when the wall thickness H1 is lower than 0.3 mm, defects are caused from other reasons. These defects are a defective charge of resin J caused when resin J does not flow into the space completely and pin holes caused when air is involved. It is considered that these defects are caused when the wall thickness is too small.

According to the data described above, the present inventors have determined that the surface is to be subjected to satin finish on which the maximum surface roughness $H_{max}$ in the recess 3A is 3 to 10 μm, and it is clear that molding is effected in a good condition when the wall thickness H1 is in a range from 2.0 to 0.3 mm.

In FIG. 4, character M is a mark for identifying the type of a product and the manufacturer. This mark is made by means of laser beam. This type laser beam marking is effected in such a manner that carbon of a pigment contained in the resin is heated by laser beams so that the heated portion becomes discolored. In order to obtain a higher contrast, as disclosed in Japanese Unexamined Patent Publication No. 4-257246, it is preferable that the surface to be marked is made to be a mirror surface. From the above reason, in this embodiment, a marking face 8B of the resin body 8 was subjected to mirror finish on which the surface roughness was not more than 1μm. Numeral 8C is a trace of the gate from which the resin J was injected.

When the recess 2A of the upper metallic mold 2 for forming the marking face 8B of the resin body 8 is formed into a mirror surface on which the surface roughness is not more than 1 μm, the resin body 8 is left on the upper metallic mold 2 side when the resin body 8 is released from the metallic mold 1, wherein the metallic mold 1 is divided into the upper and lower metallic molds 2, 3. In this embodiment, as shown by an imaginary line E in FIG. 1, and ejector pin is provided on the upper metallic mold 2 side, and when the resin body 8 has been left on the upper metallic mold 2 side, the ejector pin E is operated downward, so that the resin body 8 can be ejected from the upper metallic mold 2.

Due to the foregoing, an influence caused by the current of injected resin or the pressure can be reduced as small as possible. That is, it is possible to reduce a possibility that semi-molten resin is involved in a resin current injected into a void, a cloudy pattern is formed to deteriorate the appearance, water enters the resin from the cloudy pattern, and the semiconductor element is affected. It is also possible to reduce a possibility that a blister is caused when the resin body is released from the metallic mold, so that the deterioration of heat radiation property can be reduced. Since the possibility of occurrence of the cloudy pattern can be reduced, there is no possibility that the appearance of a product is deteriorated.

When the present invention is applied to a power transistor, the island of which is very large so that the problems of a cloudy pattern and blister are remarkable, the present invention can provide more excellent effects.

What is claimed is:

1. A method of manufacturing a semiconductor device for power supply use comprising the steps of:

forming a void having opposed faces in a pair of mating metallic mold members;

assembling a semiconductor element onto a first face of an island of a lead frame;

arranging the island in the void with a second face of the island on the opposite side thereof from the first face being spaced from a first face of the void;

providing a clearance of 0.3 to 2.0 mm between the second face of the island and the first face of the void in the metallic mold and providing a larger clearance between the first face of the island and a second face of the void in the metallic mold member opposed to the first face of the island;

providing a satin finish in which the maximum surface roughness $H_{max}$ is in a range from 3 to 10 μm on the first face of the void opposed to the second face of the island; and injecting a thermosetting resin into the void.

2. The method of manufacturing a semiconductor device for power supply use according to claim 1, wherein the semiconductor device for power supply use is a power transistor.

3. The method of manufacturing a semiconductor device for power supply use according to claim 1, wherein a gate from which the thermosetting resin is injected is provided in the pair of mold members at a location opposed to an end of the island.

4. The method of manufacturing a semiconductor device for power supply use according to claim 3, wherein a tapered portion is provided at the end of the island opposed to the gate, and the tapered portion tapers off to one face of the metallic mold opposed to the second face of the island.

5. The method of manufacturing a semiconductor device for power supply use according to claim 1, wherein the second face of the void in the metallic mold members is a mirror face of which surface roughness is not more than 1 μm.

6. The method of manufacturing a semiconductor device for power supply use according to claim 1, wherein a bend portion formed between the lead of the lead frame and the island is formed into a down-set structure in which the clearance between the second face of the island and the first face of the void in the metallic mold members is smaller than the clearance between the first face of the island and the second face of the void in the metallic mold members.

7. The method of manufacturing a semiconductor device for power supply use according to claim 1, including the additional step of ejecting the semiconductor device from the pair of metallic mold members.

8. The method of manufacturing a semiconductor device for power supply use according to claim 7, wherein the semiconductor device is ejected from the pair of metallic mold members by at least one ejector pin disposed in one of the pair of metallic mold members.

* * * * *